United States Patent
Tseng et al.

(10) Patent No.: US 11,162,777 B2
(45) Date of Patent: *Nov. 2, 2021

(54) WAFER ALIGNMENT MARK SCHEME

(71) Applicant: Taiwan Semiconductor Manufacturing Company, Ltd., Hsinchu (TW)

(72) Inventors: Wei-Hsiang Tseng, Hsinchu (TW); Chin-Hsiang Lin, Hsinchu (TW); Heng-Hsin Liu, New Taipei (TW); Jui-Chun Peng, Hsinchu (TW); Ho-Ping Chen, Jhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/725,222

(22) Filed: Dec. 23, 2019

(65) Prior Publication Data
US 2020/0132436 A1 Apr. 30, 2020

Related U.S. Application Data

(60) Continuation of application No. 15/864,458, filed on Jan. 8, 2018, now Pat. No. 10,514,247, which is a
(Continued)

(51) Int. Cl.
*G01B 11/02* (2006.01)
*H01L 23/544* (2006.01)
*G03F 9/00* (2006.01)

(52) U.S. Cl.
CPC .......... *G01B 11/02* (2013.01); *G03F 9/7011* (2013.01); *G03F 9/7084* (2013.01); *H01L 23/544* (2013.01); *H01L 2924/0002* (2013.01)

(58) Field of Classification Search
CPC ...... G01B 11/02; G03F 9/7011; G03F 9/7084; H01L 23/544; H01L 2924/0002
See application file for complete search history.

(56) References Cited

U.S. PATENT DOCUMENTS 4,952,060 A * 8/1990 Ina .................... G03F 9/7084
356/400
5,601,957 A 2/1997 Mizutani et al.
(Continued)

FOREIGN PATENT DOCUMENTS

KR 101999004579 A 1/1999
KR 1020040040967 A 5/2004
(Continued)

OTHER PUBLICATIONS

Notice of Allowance dated Sep. 29, 2014 from corresponding No. KR 10-2012-0114626.
(Continued)

*Primary Examiner* — Jamil Ahmed
(74) *Attorney, Agent, or Firm* — Slater Matsil, LLP

(57) ABSTRACT

A wafer alignment apparatus includes a light source, a light detection device, and a rotation device configured to rotate a wafer. The light source is configured to provide a light directed to the wafer. The light detection device is configured to detect reflected light intensity from the wafer to locate at least one wafer alignment mark of wafer alignment marks separated by a plurality of angles. At least two of those angles are equal.

20 Claims, 4 Drawing Sheets

Related U.S. Application Data continuation of application No. 14/486,514, filed on Sep. 15, 2014, now Pat. No. 9,863,754, which is a division of application No. 13/485,224, filed on May 31, 2012, now abandoned.

(60) Provisional application No. 61/616,975, filed on Mar. 28, 2012.

(56) References Cited

U.S. PATENT DOCUMENTS

| | | |
|---|---|---|
| 2001/0028456 A1 | 10/2001 | Nishi |
| 2003/0081189 A1 | 5/2003 | Minami |
| 2007/0002323 A1* | 1/2007 | Fukui .................... G03F 9/7088 356/401 |
| 2007/0020871 A1 | 1/2007 | Chen et al. |
| 2009/0146325 A1* | 6/2009 | Liu ....................... H01L 23/544 257/797 |
| 2011/0001974 A1 | 1/2011 | Harada et al. |
| 2011/0317163 A1* | 12/2011 | Lee ....................... G03F 9/7046 356/401 |

FOREIGN PATENT DOCUMENTS

| | | |
|---|---|---|
| KR | 1020070014585 A | 2/2007 |
| TW | I332689 B | 11/2010 |

OTHER PUBLICATIONS

Office Action dated Nov. 15, 2013 with English Translation from corresponding application No. KR 10-2012-0114626.

Office Action dated Jul. 25, 2014 from corresponding application No. TW 101141251.

\* cited by examiner

WAFER ALIGNMENT MARK SCHEME

PRIORITY CLAIM AND CROSS-REFERENCE

This application is a continuation of U.S. patent application Ser. No. 15/864,458 which was filed on Jan. 8, 2018, which is a continuation of U.S. patent application Ser. No. 14/486,514 which was filed on Sep. 15, 2014, now U.S. Pat. No. 9,863,754 issue on Jan. 9, 2018, which is a divisional application of U.S. patent application Ser. No. 13/485,224, filed on May 31, 2012, which claims priority of U.S. Provisional Patent Application No. 61/616,975, filed on Mar. 28, 2012, which applications are incorporated herein by reference in their entireties.

TECHNICAL FIELD

The present disclosure relates generally to an integrated circuit and more particularly to a wafer alignment mark.

BACKGROUND

For an integrated circuit fabrication process, some wafers have a notch for wafer alignment. For such a wafer, the wafer is rotated 360° in some cases to find the wafer notch for alignment. However, the wafer notch may result in random solvent splash on the wafer during a wafer edge cleaning process, which is a defect source and can induce yield penalty. Also, such solvent splash can induce arcing effect during an etching process of the wafer.

BRIEF DESCRIPTION OF THE DRAWINGS

Reference is now made to the following descriptions taken in conjunction with the accompanying drawings, in which.

DETAILED DESCRIPTION

Figure 1A:
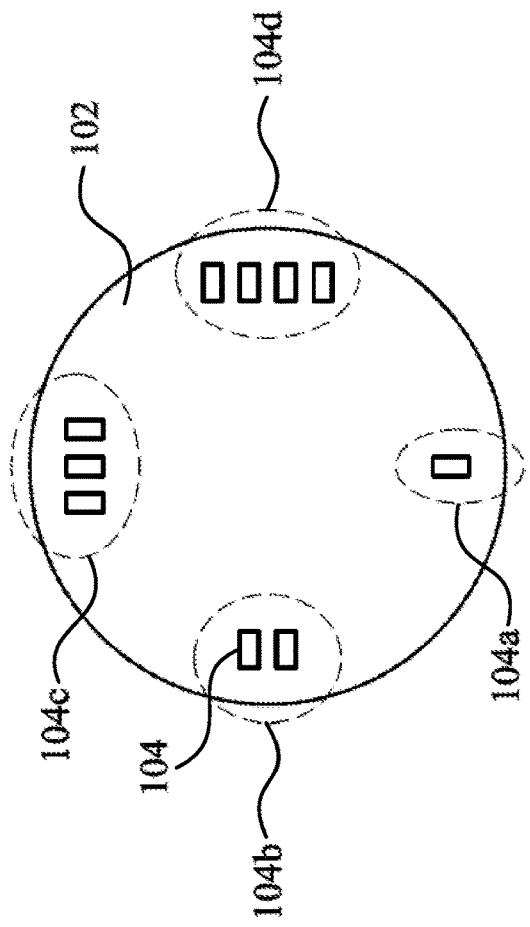
FIG. 1A is a schematic diagram of an exemplary wafer with wafer alignment marks according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary wafer 102 with wafer alignment marks 104 according to some embodiments. The wafer 102 has wafer alignment marks 104 at a backside 103. There are four exemplary wafer alignment marks 104 centered at positions evenly distributed along the edge of the wafer 102 as shown in FIG. 1A: a first wafer alignment mark 104a having one recess (opening, hole, or cut), a second wafer alignment mark 104b having two recesses, a third wafer alignment mark 104c having three recesses, and a fourth wafer alignment mark 104d having four recesses. The wafer 102 comprises silicon or any other suitable material. The wafer alignment marks 104 are formed on the wafer's backside by laser or etching, for example.

The four wafer alignment marks 104a, 104b, 104c, and 104d are formed centered at 0°, 90°, 180°, and 270° respectively along the edge of the wafer 102. Therefore, by rotating the wafer 102 by 90°, one of the four wafer alignment marks will be detected to find the alignment position. If a different number of wafer alignment marks 104 are used, the positions of the wafer alignment marks 104 can be evenly distributed by dividing 360° by the number of the wafer alignment marks 104. For example, if there are three wafer alignment marks 104, they can be distributed at 0°, 120°, 240°. In this case, the wafer can be rotated by 120° to find one of the wafer alignment marks 104 to find the alignment position. In other embodiments, the wafer alignment marks 104 can be distributed unevenly depending on the applications.

The size of the wafer alignment marks 104 are from (1 mm×1 mm) to (5 mm×5 mm) in some embodiments. The wafer alignment marks 104 have a depth of 0.12 µm in one example. The shape of the wafer alignment marks 104 can be different shapes, such as a circle, triangle, square or any other polygon, for example.

Figure 1C:
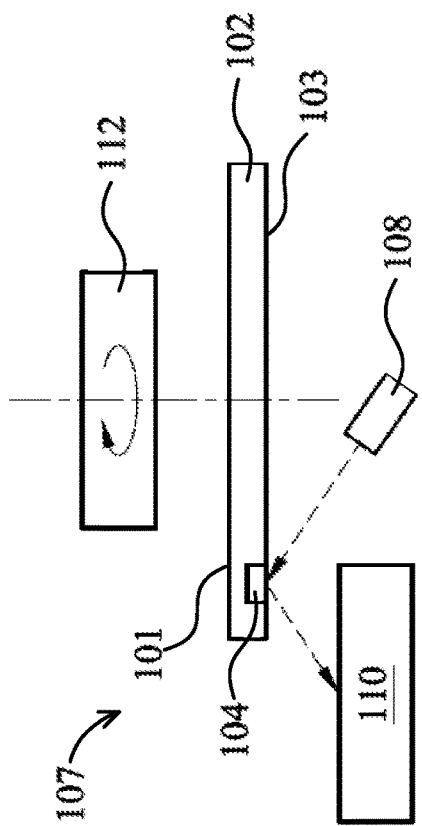
FIG. 1C is a schematic diagram of an exemplary wafer alignment mark detection setup according to some embodiments.
Figure 1B:
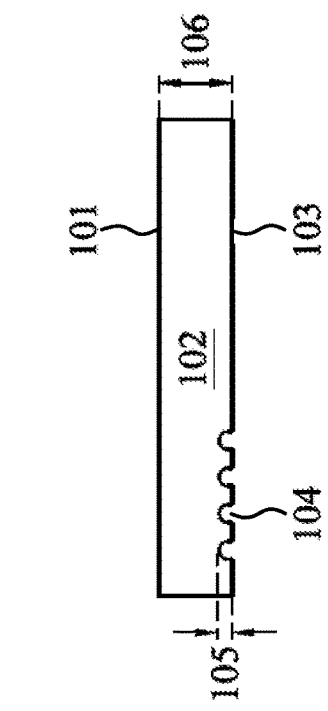
FIG. 1B is a cross-section view of an exemplary wafer with wafer alignment marks according to some embodiments.

FIG. 1B is a cross-section view of exemplary wafer 102 with wafer alignment marks 104 according to some embodiments. The wafer 102 has a front side 101 used as a main surface for integrated circuit formation and the backside 103. The wafer alignment marks 104 are formed on the backside 103 of the wafer 102. The wafer 102 has a thickness 106 ranging from 100 µm to 300 µm in some embodiments. The wafer alignment marks 104 (recesses) have a depth 105 ranging from 100 nm to 200 nm in some embodiments. If the depth 105 is less than 100 nm, the detection of the wafer alignment marks 104 may need higher sensitivity to recognize the difference in reflected light intensity due to the wafer alignment marks 104. If the depth 105 is greater than 200 nm, particles may remain in the wafer alignment marks 105.

FIG. 1C is a schematic diagram of an exemplary wafer alignment mark detection setup 107 according to some embodiments. A light source 108 such as laser and a light detection device 110 such as charge-coupled device (CCD) sensor are located under the wafer 102. As the wafer 102 is rotated by a rotation device 112 for a specified angle, light transmitted from the light source 108 is directed to the wafer backside 103 and reflected to the light detection device 110. The light detection device 110 such as a CCD sensor collects the light intensity distribution to find the wafer alignment position. In some embodiments, the detected light intensity is reduced at the wafer alignment mark 104 positions to find the alignment positions.

By using the wafer alignment mark 104 formed on the backside 103 of the wafer 102, solvent splash impact is reduced during the wafer edge cleaning process. With four wafer alignment mark 104 evenly spaced as shown in FIG. 1A, the alignment mark search time (e.g., rotating the wafer 90°) is reduced 75% compared to finding a notch by rotating the wafer 360°. Therefore, the wafer process yield time is improved.

Figure 2A:
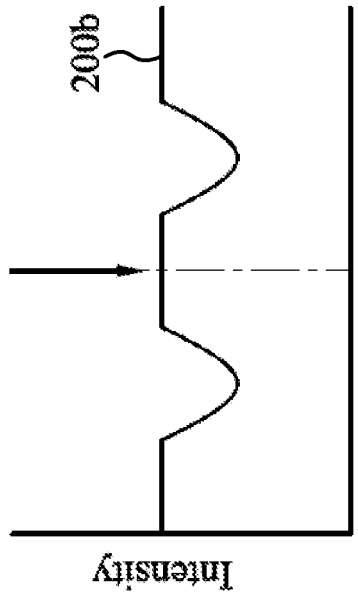
FIGS. 2A-2D are plots of detected light intensity versus wafer position for the exemplary wafer alignment marks in FIG. 1A according to some embodiments.

FIGS. 2A-2D are plots 200a-200d of detected light intensity versus wafer position for the exemplary wafer alignment marks in FIG. 1A according to some embodiments. In FIG. 2A, the (light) intensity plot 200a shows finding the position 1 of the first wafer alignment mark 104a in FIG. 1A with one recess (opening, hole, or cut). As the wafer 102 is rotated 90 degrees, the detected light intensity is reduced at position 1 due to the first wafer alignment mark 104a. Since the detected intensity is reduced one time, the position 1 is found as the first wafer alignment mark 104a. The position 1 can be used for the wafer alignment. In some embodiments, a computer, a processor, or a memory can be used to monitor the detected intensity or save the position for alignment.

Figure 2B:
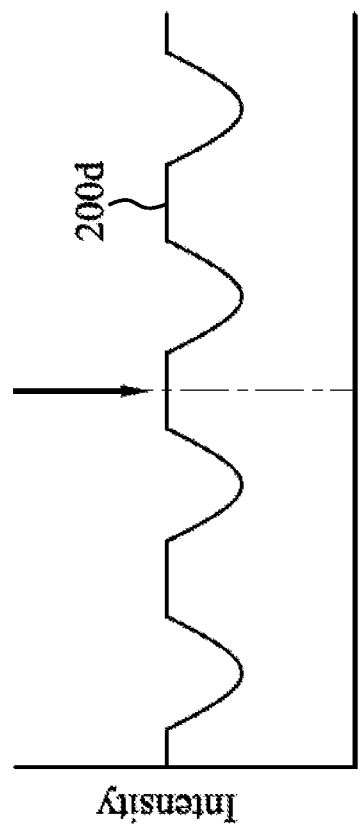

In FIG. 2B, the (light) intensity plot 200b shows finding the position II of the second wafer alignment mark 104b in FIG. 1A with two recesses. As the wafer 102 is rotated 90 degrees, the detected light intensity is reduced two times centered at the position II due to the second wafer alignment mark 104b. The position II is found as the second wafer alignment mark 104b. The position II can be used for the wafer alignment.

Figure 2C:
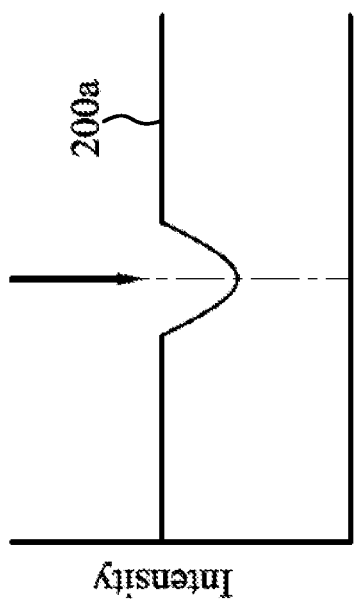

In FIG. 2C, the (light) intensity plot 200c shows finding the position III of the third wafer alignment mark 104c in FIG. 1A with three recesses. As the wafer 102 is rotated 90 degrees, the detected light intensity is reduced three times centered at the position III due to the third wafer alignment mark 104c. The position III is found as the third wafer alignment mark 104c. The position III can be used for the wafer alignment.

Figure 2D:
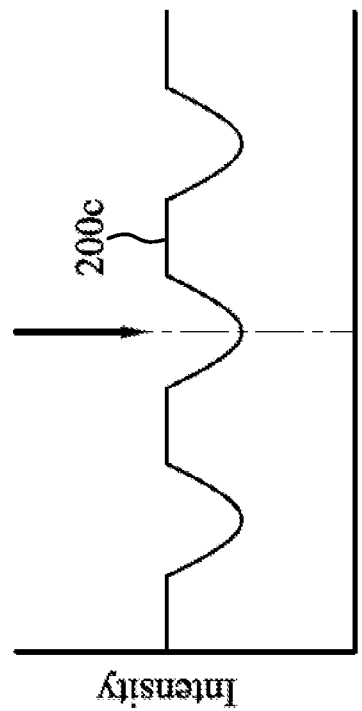

In FIG. 2D, the (light) intensity plot 200d shows finding the position IV of the fourth wafer alignment mark 104d in FIG. 1A with four recesses. As the wafer 102 is rotated 90 degrees, the detected light intensity is reduced four times centered at the position IV due to the fourth wafer alignment mark 104d. The position IV is found as the fourth wafer alignment mark 104d. The position IV can be used for the wafer alignment.

Even though the number of recesses is counted to find and identify wafer alignment marks 104 in the examples, different shapes or patterns comprising multiple small recesses can be used for the wafer alignment marks 104 with the light detection device 110 recognizing the shapes or patterns.

Figure 3:
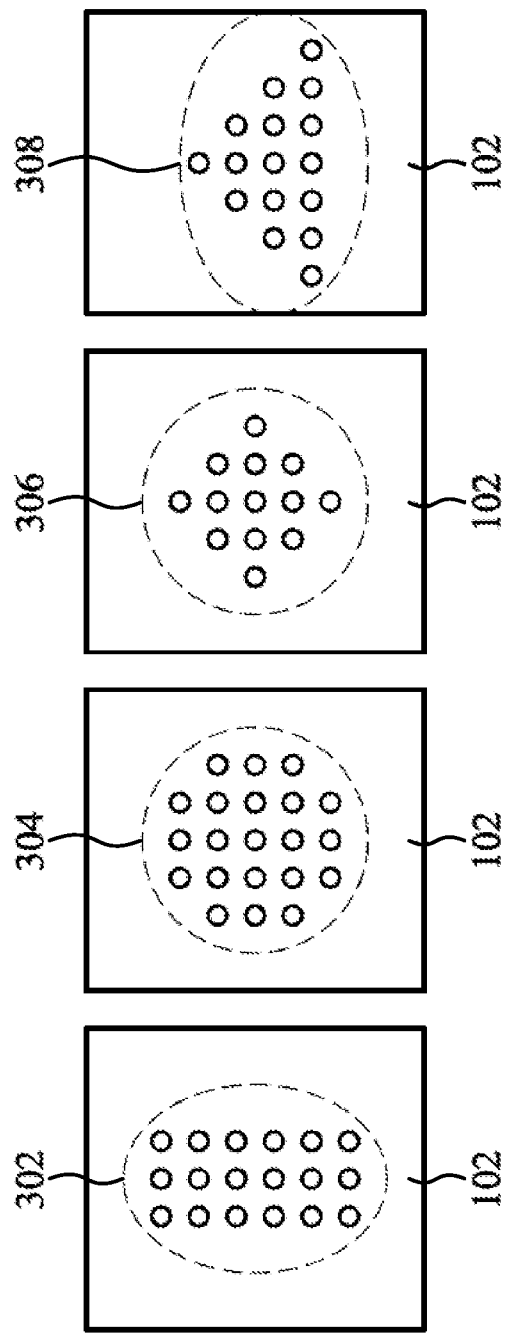
FIG. 3 is a schematic diagram of exemplary wafer alignment mark shapes according to some embodiments.

FIG. 3 is a schematic diagram of exemplary wafer alignment mark shapes according to some embodiments. FIG. 3 shows different wafer alignment mark shapes 302, 304, 306, and 308 comprising multiple small recesses or holes (dots). The light detection device 110 detects (identifies or recognizes) the shapes or patterns and find the alignment position in some embodiments. Any other shapes or patterns can be used for the wafer alignment marks 104 in FIG. 1A in other embodiments.

Figure 4:
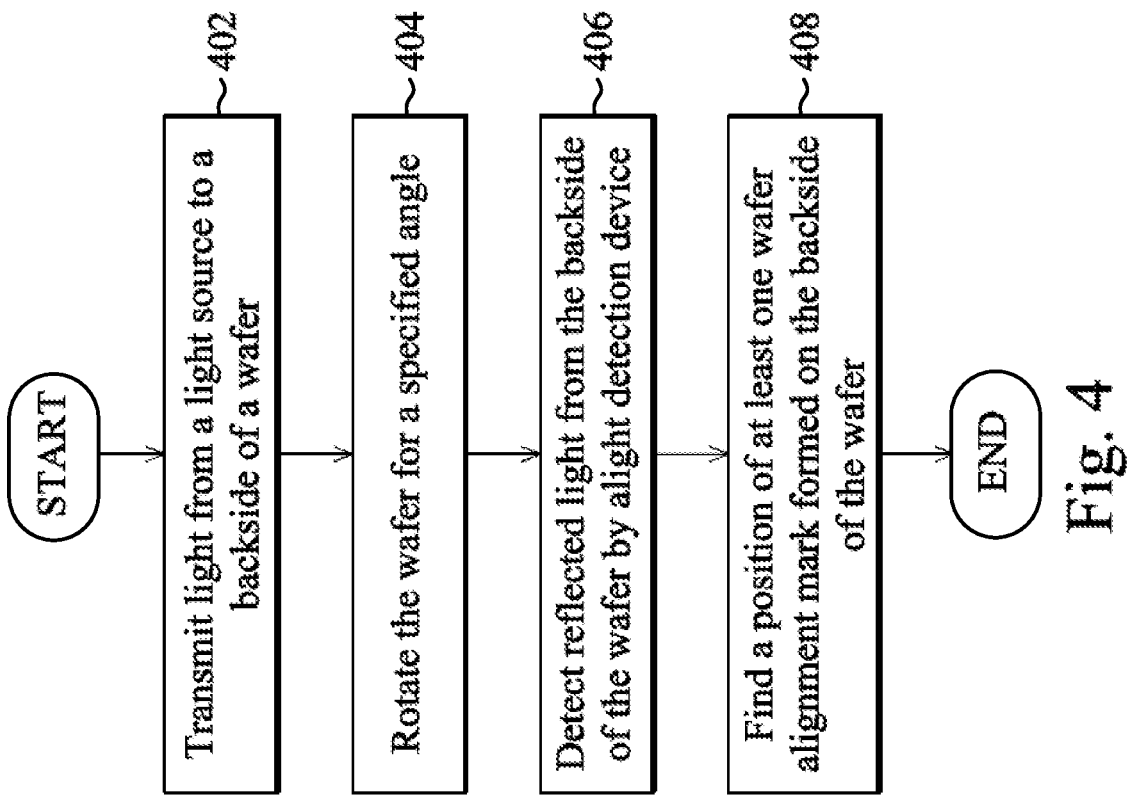
FIG. 4 is a flowchart of an exemplary method of wafer aligning using wafer alignment marks in FIG. 1A according to some embodiments.

FIG. 4 is a flowchart of an exemplary method of wafer alignment using wafer alignment marks 104 in FIG. 1A according to some embodiments. At step 402, light is transmitted from a light source to a backside of a wafer. At step 404, the wafer is rotated for a specified angle, e.g., 90°. The rotated angle is 360° divided by the number of wafer alignment marks in some embodiments. In some embodiments, if the distribution of alignments marks is uneven, the specified angle is different than 360° divided by the number of wafer alignment marks. At step 406, reflected light from the backside of the wafer is detected by a light detection device. At step 408, a position of at least one wafer alignment mark that is formed on the backside of the wafer is found.

According to some embodiments, a wafer alignment apparatus includes a light source, a light detection device, and a rotation device configured to rotate a wafer. The light source is configured to provide light directed to a backside of the wafer. The light detection device is configured to detect reflected light intensity from the backside of the wafer to find a position of at least one wafer alignment mark formed on the backside of the wafer.

According to some embodiments, a method includes transmitting light from a light source to a backside of a wafer. The wafer is rotated for a specified angle. Reflected light from the backside of the wafer is detected by a light detection device. A position of at least one wafer alignment mark formed on the backside of the wafer is found.

According to some embodiments, a wafer includes a front side used as a main surface for integrated circuit formation, a backside, and at least one wafer alignment mark formed on the backside. The at least one wafer alignment mark is configured to change a light intensity reflected from the backside in order to find a position of the at least one wafer alignment mark.

An aspect of this description relates to a wafer alignment apparatus. The wafer alignment apparatus comprises a light source, a light detection device, and a rotation device configured to rotate a wafer. The light source is configured to provide a light directed to the wafer. The light detection device is configured to detect reflected light intensity from the wafer to locate at least one wafer alignment mark of wafer alignment marks separated by a plurality of angles. At least two of those angles are equal.

Another aspect of this description relates to a method comprising transmitting light from a light source to a wafer, rotating the wafer for a specified angle, detecting reflected light from the wafer by a light detection device, and locating at least one wafer alignment mark of wafer alignment marks separated by a plurality of angles, and at least two of those angles are equal.

A further aspect of this description relates to a wafer that has wafer alignment marks. At least one wafer alignment mark is configured to change a light intensity reflected from the wafer in order to locate the at least one wafer alignment mark. The wafer alignment marks are separated by a plurality of angles, and at least two of the angles are equal.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A semiconductor device comprising:
a semiconductor wafer comprising a first side and a second side opposite the first side;
active devices located adjacent to the first side;
a first alignment mark in the second side, the first alignment mark comprising first recesses, wherein the first recesses change a light intensity reflected from the semiconductor wafer a first amount; and
a second alignment mark in the second side, the second alignment mark comprising second recesses, the second recesses being identifiably different from the first recesses while the semiconductor wafer is rotated during illumination, wherein the second recesses change a light intensity reflected from the semiconductor wafer a second amount identifiably different from the first amount.

2. The semiconductor device of claim 1, wherein the second alignment mark is located 90° away from the first alignment mark.

3. The semiconductor device of claim 1, wherein the second alignment mark is located 120° away from the first alignment mark.

4. The semiconductor device of claim 1, further comprising a third alignment mark comprising third recesses, the third recesses being identifiably different from the first recesses and the second recesses.

5. The semiconductor device of claim 4, further comprising a fourth alignment mark comprising fourth recesses, the fourth recesses being identifiably different from the first alignment mark, the second alignment mark, and the third alignment mark.

6. The semiconductor device of claim 5, where each one of the first alignment mark, the second alignment mark, the third alignment mark, and the fourth alignment mark are located equally away from each other.

7. The semiconductor device of claim 1, wherein the first alignment mark has a pyramidal shape.

8. A semiconductor device comprising:
a semiconductor wafer;
a first set of recesses within the semiconductor wafer, wherein each recess within the first set of recesses is aligned with other recesses within the first set of recesses; and
a second set of recesses within the semiconductor wafer, the second set of recesses having a different number of recesses from the first set of recesses, the second recesses being identifiably different from the first recess during an illumination with a rotation, wherein each recess within the second set of recesses is aligned with other recesses within the second set of recesses.

9. The semiconductor device of claim 8, wherein each recess within the first set of recesses is filled with a dielectric material.

10. The semiconductor device of claim 8, wherein the first set of recesses is located 90° away from the second set of recesses.

11. The semiconductor device of claim 8, wherein the first set of recesses has a pyramidal shape.

12. The semiconductor device of claim 8, wherein the first set of recesses is located 120° away from the second set of recesses.

13. The semiconductor device of claim 8, wherein the first set of recesses has a square shape.

14. The semiconductor device of claim 8, wherein the first set of recesses has a first depth of about 0.12 µm.

15. A semiconductor device comprising:
a semiconductor wafer with a first quadrant, a second quadrant, a third quadrant, and a fourth quadrant;
a first alignment mark located within the first quadrant;
a second alignment mark located within the second quadrant;
a third alignment mark located within the third quadrant; and
a fourth alignment mark located within the fourth quadrant, wherein reflected light is identifiably different based on which of the first alignment mark, the second alignment mark, the third alignment mark, and the fourth alignment mark reflects the reflected light during a rotation and an illumination.

16. The semiconductor device of claim 15, wherein the first alignment mark has a first depth of about 0.12 µm.

17. The semiconductor device of claim 15, wherein the first alignment mark has a first depth of between about wo nm and about 200 nm.

18. The semiconductor device of claim 15, wherein the first alignment mark has a rectangular shape.

19. The semiconductor device of claim 15, wherein the first alignment mark is located 90° away from the second alignment mark.

20. The semiconductor device of claim 15, wherein the first alignment mark comprises a plurality of circular holes.

* * * * *

UNITED STATES PATENT AND TRADEMARK OFFICE
CERTIFICATE OF CORRECTION

PATENT NO. : 11,162,777 B2  
APPLICATION NO. : 16/725222  
DATED : November 2, 2021  
INVENTOR(S) : Wei-Hsiang Tseng et al.

Page 1 of 1

It is certified that error appears in the above-identified patent and that said Letters Patent is hereby corrected as shown below:

In the Claims

Claim 17, Column 6; Lines 48-49 delete "about wo nm" insert --about 100 nm--

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*